(12) United States Patent
Jeong et al.

(10) Patent No.: US 7,859,604 B2
(45) Date of Patent: Dec. 28, 2010

(54) PAD AREA AND METHOD OF FABRICATING THE SAME

(75) Inventors: Chang-Yong Jeong, Suwon-si (KR); Tae-Wook Kang, Suwon-si (KR); Won-Kyu Kwak, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 864 days.

(21) Appl. No.: 11/540,543

(22) Filed: Oct. 2, 2006

(65) Prior Publication Data
US 2007/0076393 A1   Apr. 5, 2007

(30) Foreign Application Priority Data
Sep. 30, 2005   (KR) ............... 10-2005-0092289

(51) Int. Cl.
*G02F 1/136* (2006.01)
(52) U.S. Cl. .............. 349/43; 257/59; 257/72; 257/E27.13
(58) Field of Classification Search ............. 361/767; 349/42, 43, 139, 149, 151, 152
See application file for complete search history.

(56) References Cited

U.S. PATENT DOCUMENTS

| | | | | |
|---|---|---|---|---|
| 5,731,856 A * | 3/1998 | Kim et al. | ............. | 349/43 |
| 5,767,926 A * | 6/1998 | Kim et al. | ............. | 349/38 |
| 5,790,212 A * | 8/1998 | Lim | ............. | 349/42 |
| 6,111,628 A * | 8/2000 | Shiota et al. | ............. | 349/150 |
| 6,128,063 A * | 10/2000 | Uchiyama et al. | ............. | 349/150 |
| 6,198,522 B1 * | 3/2001 | Yanagi | ............. | 349/152 |
| 6,284,086 B1 * | 9/2001 | Cardellino et al. | ............. | 156/273.7 |
| 6,350,668 B1 * | 2/2002 | Chakravorty | ............. | 438/612 |
| 6,781,109 B2 * | 8/2004 | Izumi et al. | ............. | 250/214.1 |
| 6,781,653 B2 * | 8/2004 | Park et al. | ............. | 349/113 |
| 6,958,193 B2 * | 10/2005 | Itaya et al. | ............. | 428/516 |
| 6,985,193 B2 | 1/2006 | Jang | | |
| 6,985,205 B2 * | 1/2006 | Chol et al. | ............. | 349/187 |
| 7,081,404 B2 * | 7/2006 | Jan et al. | ............. | 438/613 |
| 7,248,323 B2 * | 7/2007 | Ahn et al. | ............. | 349/141 |
| 7,443,478 B2 * | 10/2008 | Hirakata et al. | ............. | 349/149 |
| 7,528,921 B2 * | 5/2009 | Ahn et al. | ............. | 349/153 |
| 2001/0000440 A1 * | 4/2001 | Hirakata et al. | ............. | 349/155 |
| 2002/0071087 A1 * | 6/2002 | Suzuki et al. | ............. | 349/155 |
| 2002/0158995 A1 * | 10/2002 | Hwang et al. | ............. | 349/43 |
| 2004/0124414 A1 * | 7/2004 | Jang et al. | ............. | 257/59 |
| 2004/0189919 A1 * | 9/2004 | Ahn et al. | ............. | 349/141 |
| 2004/0257509 A1 * | 12/2004 | Lee et al. | ............. | 349/139 |

(Continued)

FOREIGN PATENT DOCUMENTS

JP     09-097814     4/1997

(Continued)

*Primary Examiner*—Leonardo Andújar
*Assistant Examiner*—William Harriston
(74) *Attorney, Agent, or Firm*—Lee & Morse, P.C.

(57) ABSTRACT

A pad area and a method of fabricating the same, wherein the pad area is formed on a substrate to contact a chip on glass (COG) or a chip on flexible printed circuit (COF) with the substrate. Changing a lower structure of the pad area increases contact points between conductive balls and an interconnection layer or reduces a step difference between an interconnection layer and a passivation layer to enhance and ensure electrical connection.

19 Claims, 11 Drawing Sheets

U.S. PATENT DOCUMENTS

| | | | |
|---|---|---|---|
| 2005/0041189 A1* | 2/2005 | Hong et al. | 349/149 |
| 2005/0122462 A1* | 6/2005 | Park | 349/149 |
| 2005/0146658 A1* | 7/2005 | Kim et al. | 349/114 |
| 2005/0174517 A1* | 8/2005 | Kim et al. | 349/114 |
| 2005/0243234 A1* | 11/2005 | Jung | 349/43 |
| 2005/0270454 A1* | 12/2005 | Ahn et al. | 349/114 |
| 2006/0139553 A1* | 6/2006 | Kang et al. | 349/149 |
| 2006/0139556 A1* | 6/2006 | Ahn et al. | 349/153 |
| 2006/0186414 A1 | 8/2006 | Hwang et al. | |
| 2006/0187383 A1* | 8/2006 | Broer et al. | 349/113 |
| 2007/0081106 A1* | 4/2007 | Cho et al. | 349/41 |

FOREIGN PATENT DOCUMENTS

| | | |
|---|---|---|
| JP | 09-115913 | 5/1997 |
| JP | 2002-169172 | 6/2002 |
| JP | 2002-229058 | 8/2002 |
| JP | 2003-202583 | 7/2003 |
| JP | 2003-273163 | 9/2003 |
| KR | 10-2000-0010429 | 2/2000 |
| KR | 10-2003-0046102 | 6/2003 |
| KR | 10-2004-0017692 | 2/2004 |
| KR | 10-2005-0003497 | 1/2005 |
| KR | 10-2006-0093573 | 8/2006 |

* cited by examiner

PAD AREA AND METHOD OF FABRICATING THE SAME

BACKGROUND OF THE INVENTION

1. Field of the Invention

The present invention relates to a pad area and a method of fabricating the same. More particularly, the present invention relates to a pad area and a method of fabricating the same that are capable of improving contact characteristics of an interconnection layer and a conductive ball by additionally forming an embossed layer having a plurality of embossed patterns under the interconnection layer of the pad area to form embossments on the interconnection layer, or reducing a step difference between the interconnection layer and a passivation layer to minimize a contact error by additionally forming an embossed layer having a single embossed pattern in a multi-layer structure of a semiconductor layer, a gate insulating layer, a gate electrode, and so on.

2. Description of the Related Art

Recently, in order to solve problems related to conventional cathode ray tube (CRT) displays, including weight and bulk, attention has turned to flat panel displays such as, e.g., liquid crystal display (LCD) devices, organic light emitting display (OLED) devices, field emission display (FED) devices and plasma display panel (PDP) devices.

LCD devices are capable of exhibiting good resolution, good color reproduction, good image quality, with low power consumption, in comparison with other flat panel displays. OLED devices are capable of having a simple structure, high optical efficiency, low voltage, direct current driving capability, and rapid signal response speed due to emissive characteristics of organic materials. FED devices are capable of exhibiting high resolution and wide viewing angles. PDP devices are capable of exhibiting high brightness, high emission efficiency, and wide viewing angles.

A flat panel display may be fabricated by forming devices on a transparent insulating substrate such as a glass or plastic substrate.

In order to operate a flat panel display, components for generating various control signals or data signals may be mounted on a predetermined region of the substrate on which the flat panel display is formed. Depending on the method used in mounting the components on the substrate, a flat panel display may be classified as a chip on glass (COG) type or a chip on flexible printed circuit (FPC) (COF) type. In a COG type flat panel display, components, e.g., integrated circuits (ICs), may be directly mounted on the substrate. In a COF type flat panel display, components, e.g., ICs, may be formed on a film (e.g., polyimide film), and the film having the components are then mounted on the substrate.

In both COG and COF type flat panel displays, a conductive pad is needed to properly mount the components on the substrate. In addition, an anisotropic conductive film (ACF) may be used between the conductive pad and the components, and an ACF ball may be disposed in the ACF to electrically connect the conductive pad and the components.

In conventional conductive pad structures, however, contact errors may result when components are mounted due to a step difference between a passivation layer surrounding an edge of the conductive pad and an interconnection of the pad, and improper contact caused by a small contact area of the ACF ball. Such contact errors may cause improper operation of the flat panel display and result in defective devices.

SUMMARY OF THE INVENTION

The present invention is therefore directed to a pad area and a method of fabricating the same, which substantially overcome one or more of the problems due to the limitations and disadvantages of the related art.

It is therefore a feature of an embodiment of the present invention to provide a pad area having a substrate, an embossed layer having an embossed pattern disposed on the substrate, an interconnection layer disposed on the embossed layer and covering at least the embossed pattern of the embossed layer, and a passivation layer surrounding an edge of the interconnection layer. The pad area may have a conductive ball disposed on the interconnection layer. The pad area may have a gate electrode pattern disposed between the substrate and the embossed layer. The pad area may have at least one of a first electrode pattern, a second electrode pattern, and a reflective layer pattern disposed on the interconnection layer. The embossed layer may be formed of a single embossed pattern. The embossed layer may be formed of at least two embossed patterns. The embossed layer may be portions of an interlayer insulating layer and a gate insulating layer. The embossed layer may be formed of at least one of a silicon layer, a gate electrode layer, a gate electrode, and an interlayer insulating layer. The interconnection layer may be flat when the embossed layer thereunder is formed of a single embossed pattern. The interconnection layer may be uneven when the embossed layer thereunder is formed of at least two embossed patterns. The interconnection layer may be higher than the passivation layer. The interconnection layer may be a portion of at least one of source and drain electrodes and a gate electrode. The passivation layer may be a portion of a planarization layer or a pixel defining layer.

It is another feature of an embodiment of the present invention to provide a method of fabricating a pad area by forming a substrate, forming a gate insulating layer and an interlayer insulating layer on the substrate, and patterning the layers to form an embossed layer, depositing source and drain electrode materials on the substrate having the embossed layer, and then patterning the electrode materials to form an interconnection layer covering at least the embossed layer, and forming a passivation layer covering an edge of the interconnection layer. Before forming the gate insulating layer, a gate electrode material may be deposited on the substrate, and then the gate electrode material may be patterned to form a gate electrode pattern. After forming the passivation layer, an auxiliary interconnection layer may be formed on the interconnection layer and the passivation layer.

It is another feature of an embodiment of the present invention to provide a method of fabricating a pad area by preparing a substrate, forming a semiconductor layer pattern on the substrate, forming a gate insulating layer on the substrate having the semiconductor layer pattern, forming a gate electrode pattern on the gate insulating layer, forming an embossed pattern having a width larger than the gate electrode pattern on the substrate having the gate electrode pattern, forming source and drain electrode materials on the substrate having the embossed pattern, and then patterning the electrode materials to form an interconnection layer covering at least the embossed pattern, and forming a passivation layer covering an edge of the interconnection layer. After forming the passivation layer, an auxiliary interconnection layer may be formed on the interconnection layer and the passivation layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2005-0092289, filed Sep. 30, 2005, in the Korean Intellectual Property Office, and entitled: "Pad Area and Method of Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
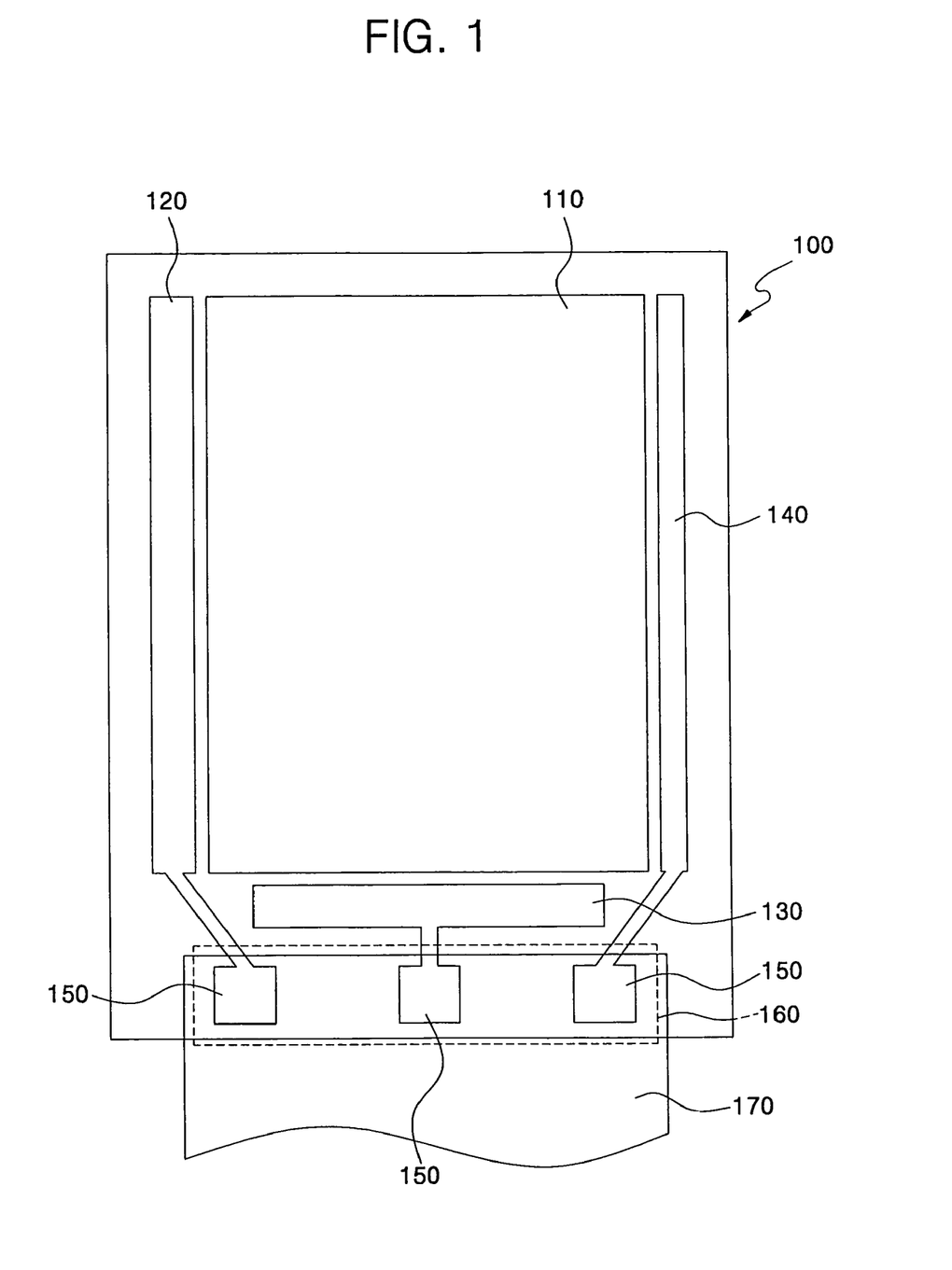
FIG. 1 illustrates a plan view of an OLED device having a pad in accordance with an embodiment of the present invention.

Referring to FIG. 1, a pixel area 110 may be disposed on a transparent insulating substrate 100 formed of glass or plastic. A scan driver 120 and a data driver 130 for applying signals to the pixel area 110, and a common power bus line 140 for applying a common power to the pixel area 110 may be disposed around the pixel area 110.

In order to receive signals or power from external components (either COG or COF), a pad area 160 may be disposed at a side portion of the substrate 100. The pad area 160 may have a plurality of pads 150, and each of the plurality of pads 150 may be connected, respectively, to the scan driver 120, the data driver 130, or the common power bus line 140.

When the pads 150 of the pad area 160 are in contact with an FCB 170 of the COF as shown in FIG. 1, an IC chip may be mounted on the pads 150 of the substrate 100, as necessary or needed.

Figure 2A:
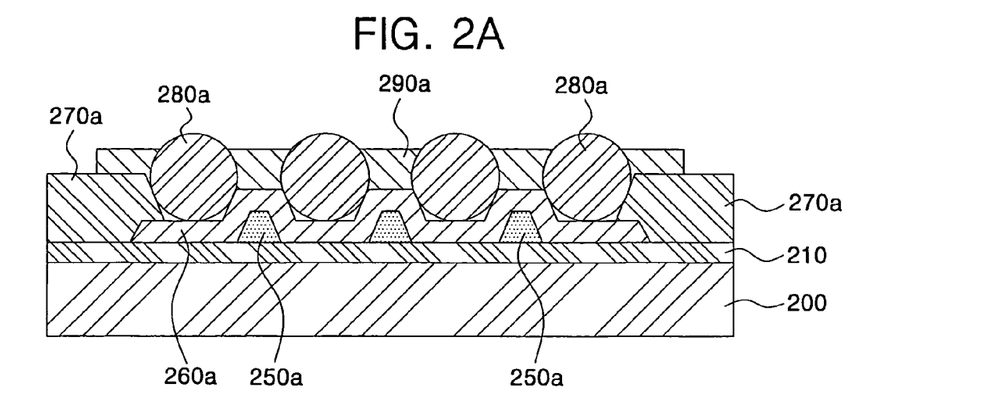
FIGS. 2A to 2C illustrate cross-sectional views of pads in accordance with alternate embodiments of the present invention.

Referring to FIG. 2A, an embodiment of a pad of the present invention may have a buffer layer 210 formed on an insulating substrate 200 formed of glass or plastic. In addition, an embossed layer having a plurality of embossed patterns 250a may be formed on the buffer layer 210. The embossed patterns 250a may be formed by patterning an insulating layer formed of a gate insulating layer, an interlayer insulating layer, or a multi-layer thereof, which may be formed on the entire surface of the substrate.

An interconnection layer 260a formed of a conductive material may be disposed on the embossed layer formed of the plurality of embossed patterns 250a. The interconnection layer 260a may be formed by patterning a gate electrode material, or source and drain electrode materials.

The interconnection layer 260a may maintain the morphology of the embossed layer formed of the plurality of embossed patterns 250a and thereby may have protrusions and recesses.

In addition, a passivation layer 270a may be disposed on the interconnection layer 260a. The passivation layer 270a may surround an edge of the interconnection layer 260a and expose the interconnection layer 260a.

Further, conductive balls 280a, e.g., ACF balls, may be disposed between the protrusions, i.e., in the recesses of the interconnection layer 260a. The conductive balls 280a and the interconnection layer 260a may be adhered to each other by an adhesive material 290a.

Therefore, conductive balls 280a disposed along the outside edge may be in contact with the interconnection layer 260a at least two contact points and conductive balls 280a disposed in a central portion may be in contact with the interconnection layer 260a at at least three contact points, whereby electrically effective contact between the conductive balls 280a and the interconnection layer 260a is enhanced. Since the conductive balls 280a basically have a spherical shape, when the interconnection layer 260a is generally flat or planar, each of the conductive balls may contact the interconnection layer 260a at only one point.

Figure 2B:
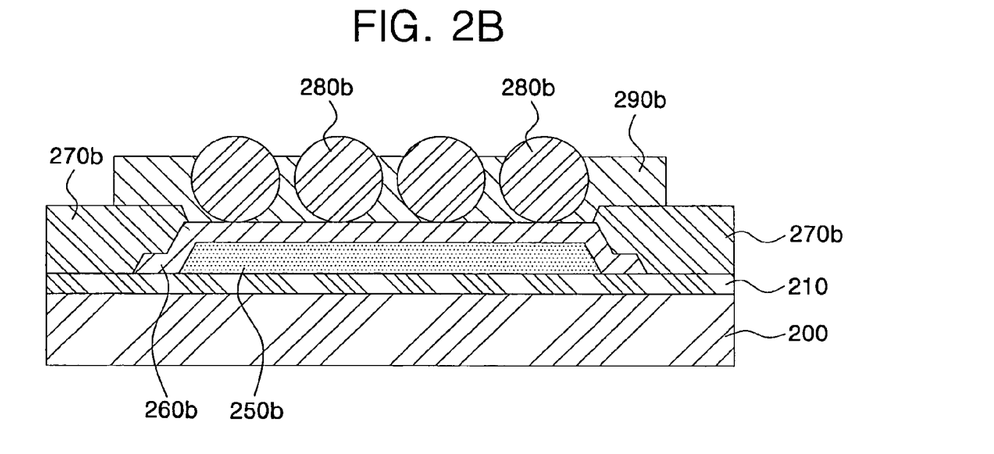

Referring to FIG. 2B, another embodiment of the pad of the present invention may have a buffer layer 210 disposed on an insulating substrate 200 such as a glass or plastic substrate. An embossed layer formed of a single embossed pattern 250b may be disposed on the buffer layer 210. The single embossed pattern 250b may be formed by patterning an insulating layer formed of a gate insulating layer, an interlayer insulating layer, or a multi-layer thereof, which may be formed on the entire surface of the substrate 200. The embossed pattern 250b may be formed simultaneously with a forming of contact holes for source and drain electrodes of a pixel area, without additional process steps or masks.

An interconnection layer 260b formed of a conductive material may be disposed on the embossed layer formed of the single embossed pattern 250b. The interconnection layer 260b may be formed by patterning a gate electrode material, or source and drain electrode materials. The interconnection layer 260b maintains the morphology of the embossed layer formed of the single embossed pattern 250b and thereby obtains a flat or planar surface over the embossed pattern 250b. In addition, since the embossed layer is disposed under the interconnection layer 260b, the interconnection layer 260b disposed over the embossed layer, i.e., a central portion of the interconnection layer, may be higher than the interconnection layer 260b which is not disposed over the embossed layer, i.e., along an edge portion of the interconnection layer.

A passivation layer 270b surrounding an edge of the interconnection layer 260b and exposing the interconnection layer 260b may be disposed on the interconnection layer 260b and the buffer layer 210. Conductive balls 280b may be disposed on the interconnection layer 260b. The conductive balls 280b and the interconnection layer 260b may be secured to each other by an adhesive material 290b. Although the passivation layers 270a and 270b shown in FIGS. 2A and 2B may have the same thickness and the conductive balls 280a and 280b may be of the same size, the conductive balls 280b in FIG. 2B project upward in comparison with the conductive balls 280a in FIG. 2A owing to and based upon the thickness of the embossed pattern 250b.

In the pad illustrated in FIG. 2B, the conductive balls 280b project upward with increased height by a simple addition of the embossed pattern 250b without reducing the thickness of the passivation layer 270b. The upward projection of the conductive balls 280b enhances the electrical contact and reliability between the pad 150 with the FPC 170 (FIG. 1).

Figure 2C:
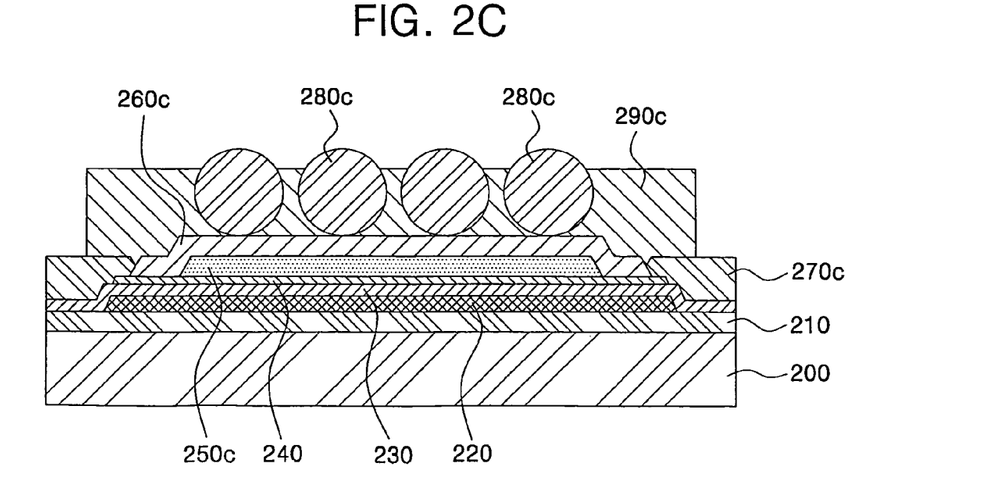

Referring to FIG. 2C, another embodiment of the pad of the present invention may have a buffer layer 210 disposed on an insulating substrate 200 formed of glass or plastic. A semiconductor layer pattern 220, a gate insulating layer 230, a gate electrode pattern 240, and an embossed pattern 250c may be disposed on the buffer layer 210. The gate insulating layer 230 may be patterned to form a gate insulating layer pattern. The semiconductor layer pattern 220, the gate insulating layer 230, and the gate electrode pattern 240 may be formed simultaneously with formation of a semiconductor layer, a gate insulating layer, and a gate electrode, respectively.

Accordingly, the embossed layer of this embodiment of the pad of the present invention may include all of the semiconductor layer pattern 220, the gate insulating layer 230, the gate electrode pattern 240, and the embossed pattern 250c, each layer or pattern of which may be removed.

Additionally, an interconnection layer 260c made of a conductive material may be disposed on the embossed layer. The interconnection layer 260c may be formed by patterning source and drain electrode materials. The gate electrode pattern 240 disposed under the embossed pattern 250c may be in electrical contact with the interconnection layer 260c and function as a conductor, i.e., an interconnection. In addition, the gate electrode pattern 240 of this embodiment of the pad as illustrated in FIG. 2C may also be applied to the other embodiments of the pad illustrated in FIGS. 2A and 2B and may be disposed under the interconnection layer 260a and 260b, respectively, and the embossed layer 250a and 250b, respectively, and on the buffer layer 210, to serve and function as an interconnection.

Further, a passivation layer 270c surrounding the interconnection layer 260c and exposing the interconnection layer 260c may be disposed on the interconnection layer 260c and the gate insulating layer 230. Areas of the interconnection layer 260c above the embossed pattern project upward with greater height in comparison with other regions, and thus the passivation layer 270c projects less and is at a lower height than the areas of the interconnection layer 260c disposed above the embossed pattern.

Conductive balls 280c may be disposed on the interconnection layer 260c, and the conductive balls 280c and the interconnection layer 260c may be adhered to each other by an adhesive material 290c.

Fabrication processes for the embodiment of the pad illustrated in FIG. 2A are illustrated by way of cross-sectional views in FIGS. 3A-3E.

Figure 3A:
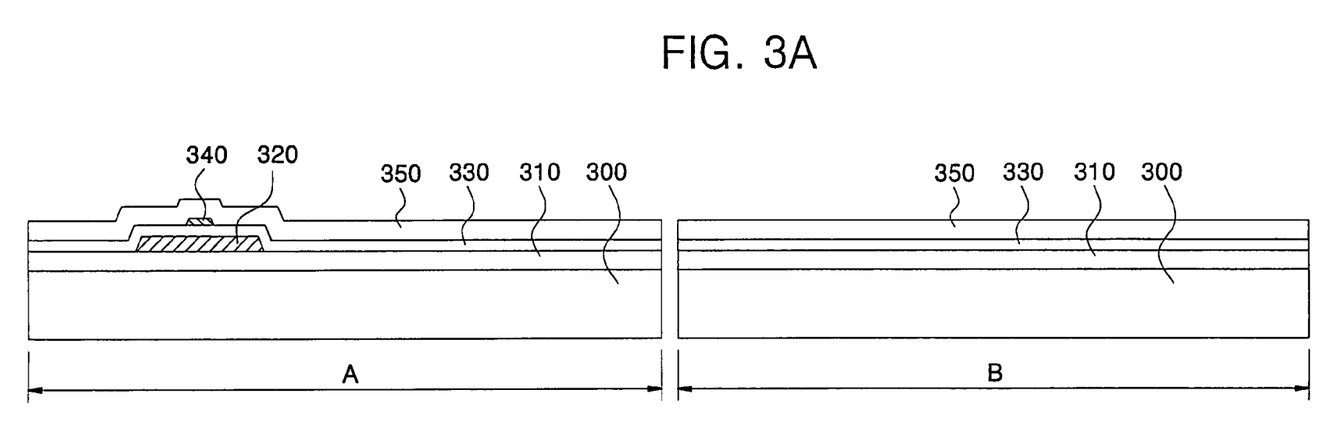
FIGS. 3A to 3E illustrate cross-sectional views of stages in a method for fabricating a pad illustrated in FIG. 2A.

Referring to FIG. 3A, a buffer layer 310 formed of a silicon oxide layer, a silicon nitride layer or a multi-layer thereof is disposed on a transparent insulating substrate 300 such as a glass or plastic substrate. The buffer layer 310 prevents diffusion of moisture or impurities generated from the lower substrate, or adjusts heat conduction speed during crystallization to promote crystallization of a semiconductor layer which may be formed on the entire surface of the substrate including a pixel area A and a pad area B.

A semiconductor layer 320 is formed on the buffer layer 310 of the pixel area A. The semiconductor layer 320 may be formed by forming an amorphous silicon layer on the substrate, crystallizing the amorphous silicon layer into a polysilicon layer using one of various crystallization methods, and then patterning the polysilicon layer.

The crystallization method may be one of a rapid thermal annealing (RTA) method, a solid phase crystallization (SPC) method, a metal induced crystallization (MIC) method, a metal induced lateral crystallization (MILC) method, a super grain silicon (SGS) method, an excimer laser crystallization (ELA) method, and a sequential lateral solidification (SLS) method.

A gate insulating layer 330 may then be formed on the entire surface of the substrate including the pixel area A and the pad area B. A gate electrode material may be deposited on the gate insulating layer 330, and then patterned to form a gate electrode 340 on the pixel area A. At this time, while not shown in FIG. 3A, a portion of the gate electrode material may remain on the pad area B to form the gate electrode pattern 240 as illustrated in FIG. 2C. An interlayer insulating layer 350 may then be formed on the entire surface of the substrate having the gate electrode 340.

Figure 3B:
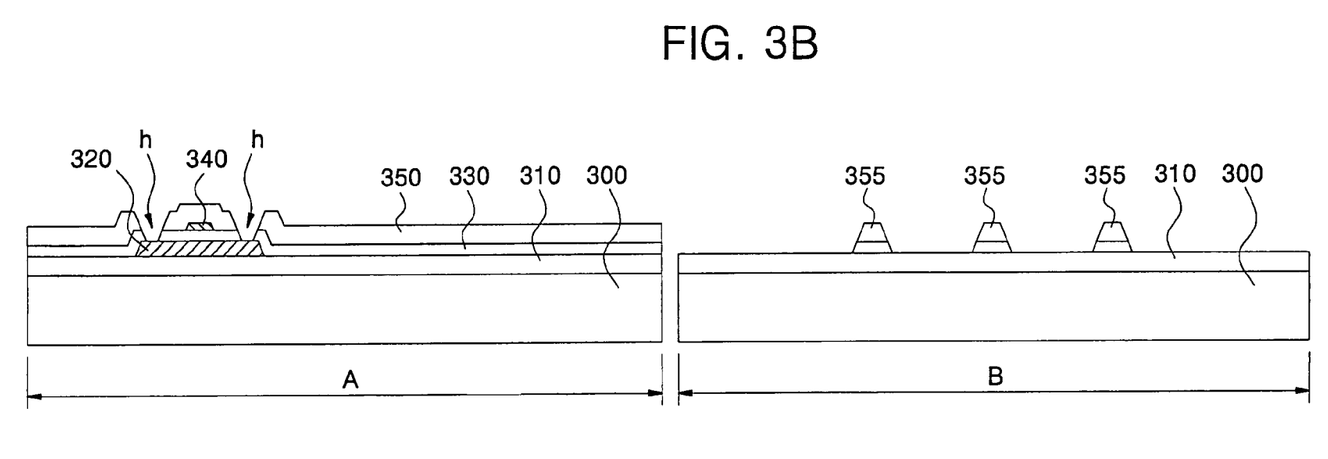

Referring to FIG. 3B, when a process for forming contact holes h for exposing portions of source and drain regions of the semiconductor layer formed on the pixel area A, i.e., a process for etching portions of the interlayer insulating layer 350 and the gate insulating layer 330, may be performed, the interlayer insulating layer 350 and the gate insulating layer 330 of the pad area B may also be etched to form a plurality of embossed patterns 355 forming an embossed layer. Preferably, the gate insulating layer 330 and the interlayer insulating layer 350 are entirely removed in regions except a region of the pad area B where the embossed patterns 355 are formed.

Figure 3C:
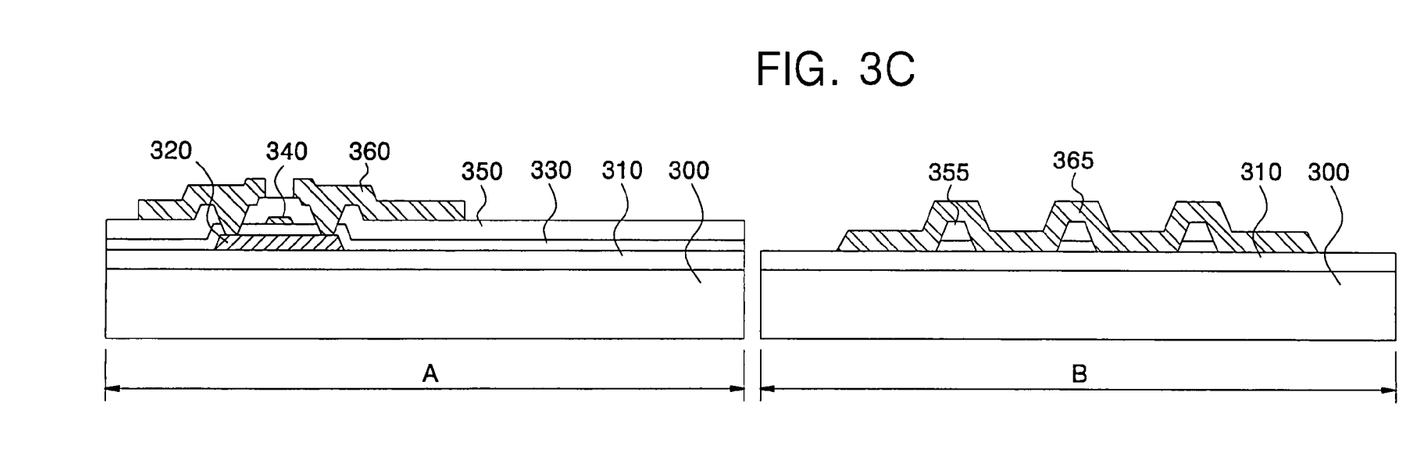

Referring to FIG. 3C, source and drain electrode materials formed of a conductive material may be deposited on the entire surface of the substrate including the pixel area A and the pad area B, and then patterned to form source and drain electrodes 360 on the pixel area A, and an interconnection layer 365 on the pad area B. The interconnection layer 365 of the pad area B has protrusions and recesses due to morphology formed by the embossed patterns 355.

Figure 3D:
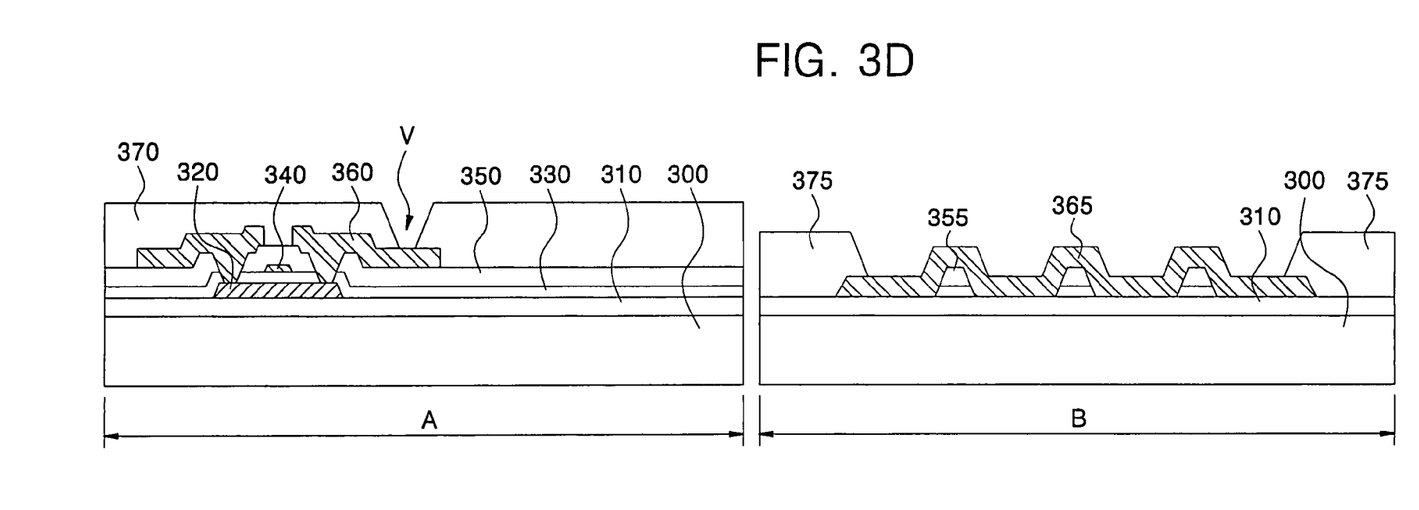

Referring to FIG. 3D, a planarization layer 370 may be formed on the entire surface of the substrate including the pixel area A and the pad area B using an organic material such as resin through a method such as spin coating. The planarization layer 370 of the pixel area A may then be etched to form a via-hole v for exposing portions of the source and drain electrodes 360, and at the same time a passivation layer 375 for exposing a central portion of the interconnection layer 365 and surrounding an edge of the interconnection layer 365 may be formed on the pad area B.

Figure 3E:
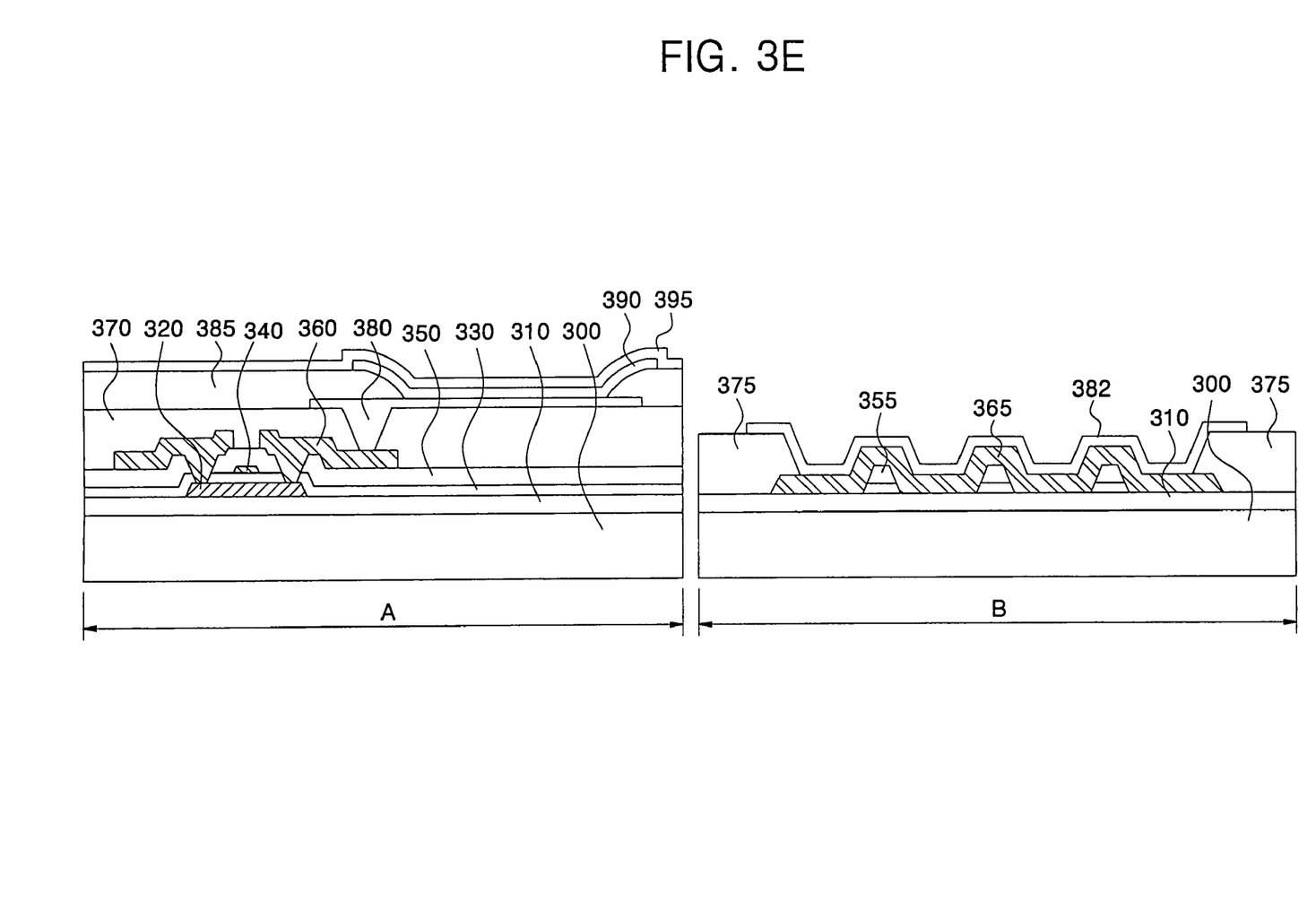

Referring to FIG. 3E, a first electrode 380 of the pixel area A, a pixel defining layer 385 for exposing a portion of the first electrode 380, which may be formed of an organic material, an organic layer 390 formed on the pixel defining layer 385 and including at least an organic emission layer, and a second electrode 395 formed on the organic layer 390 may then be sequentially deposited. A reflective layer may be additionally formed between the first electrode 380 and the planarization layer 370.

When the first and second electrodes 380 and 395 are formed on the pixel area A, at least one of a first electrode pattern, a second electrode pattern, and a reflective layer pattern may be formed on the interconnection layer 365 and the passivation layer 375 of the pad area B to additionally form an auxiliary interconnection layer 382.

The process of forming the passivation layer 375 of the pad area B when the planarization layer 370 of the pixel area A is formed as illustrated in FIG. 3D may alternatively be performed when the pixel defining layer 385 illustrated in FIG. 3E rather than the planarization layer 370 is formed.

Accordingly, when the conductive balls are in contact with the interconnection layer 365 having protrusions and recesses, each of the conductive balls may be in contact with the interconnection layer 365 at at least two points, as illustrated in FIG. 2A. When the auxiliary interconnection layer 382 is formed as illustrated in FIG. 3E, the conductive balls may be in contact with the interconnection layer 365 at at least three points.

Fabrication processes for the embodiment of the pad illustrated in FIG. 2B are illustrated by way of cross-sectional views in FIGS. 4A-4E.

Figure 4A:
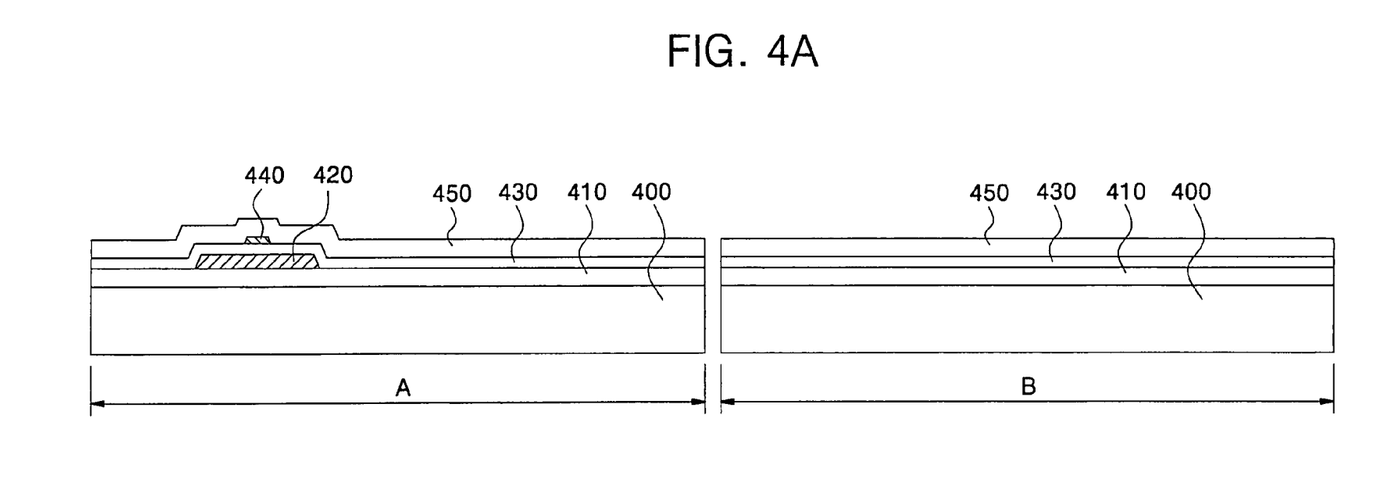
FIGS. 4A to 4E illustrate cross-sectional views of stages in a method for fabricating a pad illustrated in FIG. 2B.

Referring to FIG. 4A, a buffer layer 410 formed, e.g., of a silicon oxide layer, a silicon nitride layer, or a multi-layer thereof may be deposited on a transparent insulating substrate 400 such as a glass or plastic substrate.

The buffer layer 410 may prevent diffusion of moisture and/or impurities generated from the lower substrate, and/or may adjust heat conduction speed during crystallization to promote crystallization of a semiconductor layer which may be formed on the entire surface of the substrate including a pixel area A and a pad area B.

A semiconductor layer 420 is formed on the buffer layer 410 of the pixel area A. The semiconductor layer 420 may be formed by forming an amorphous silicon layer on the substrate, crystallizing the amorphous silicon layer into a polysilicon layer using one of various crystallization methods as noted above, and then patterning the polysilicon layer.

A gate insulating layer 430 may then be formed on the entire surface of the substrate including the pixel area A and the pad area B. A gate electrode material may be deposited on the gate insulating layer 430, and then patterned to form a gate electrode 440 on the pixel area A. At this time, while not shown in FIG. 4A, a portion of the gate electrode material may remain on the pad area B to form the gate electrode pattern 240 as illustrated in FIG. 2C. An interlayer insulating layer 450 may then be formed on the entire surface of the substrate on which the gate electrode 440 is formed, including the pixel area A and the pad area B.

Figure 4B:
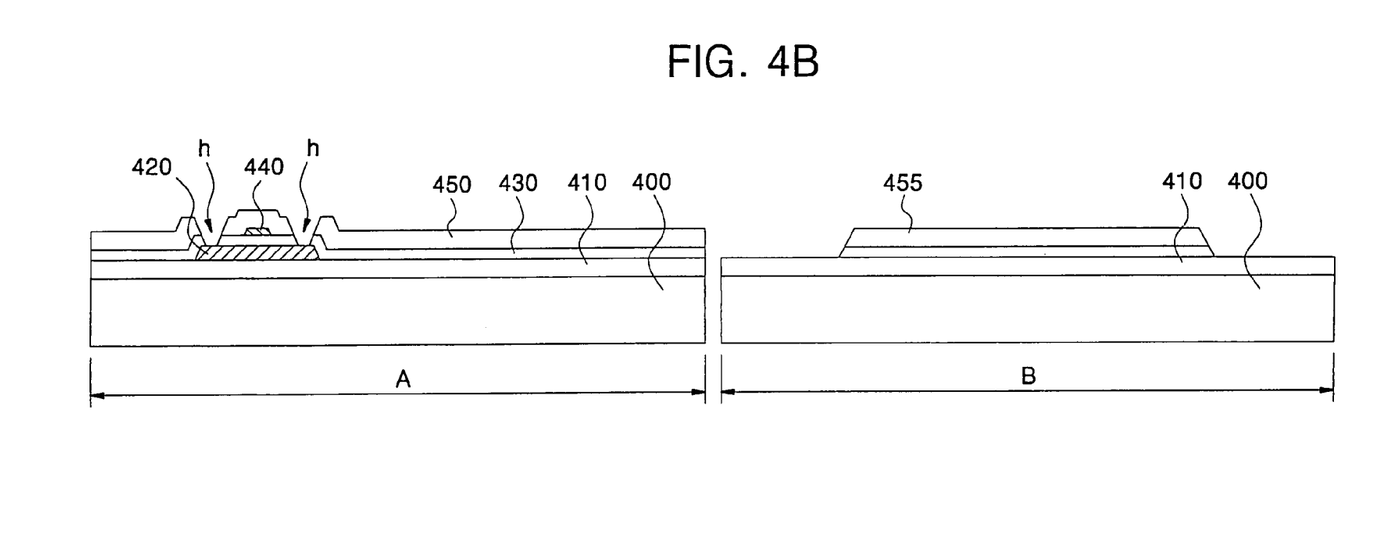

Referring to FIG. 4B, when a process of forming contact holes h for exposing portions of source and drain regions of the semiconductor layer formed on the pixel area A, i.e., a process of etching portions of the interlayer insulating layer 450 and the gate insulating layer 430, is performed, the interlayer insulating layer 450 and the gate insulating layer 430 of the pad area B may also be etched to form a plurality of embossed patterns 455 forming an embossed layer. The gate insulating layer 430 and the interlayer insulating layer 450 may be entirely removed in regions except a region of the pad area B where the embossed patterns 455 are formed.

Figure 4C:
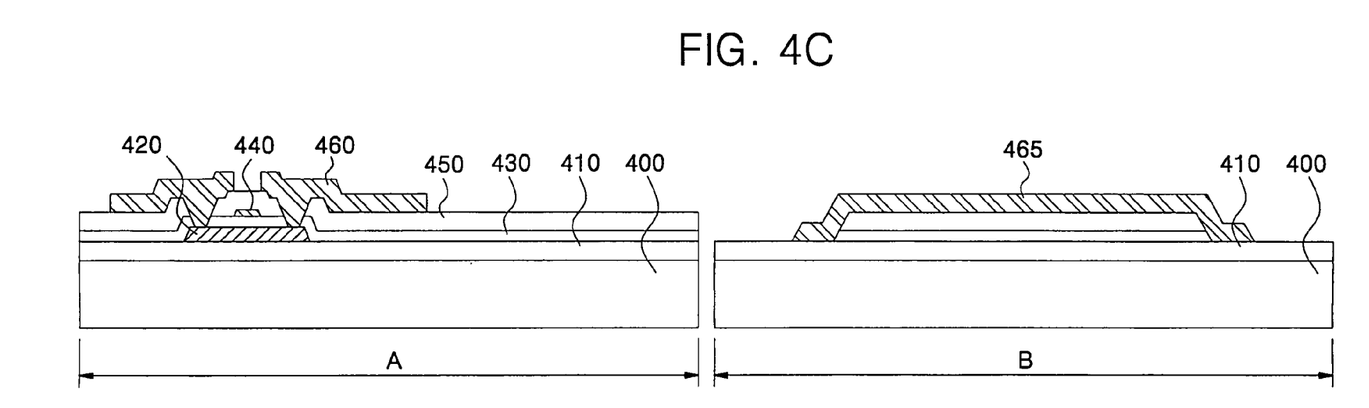

Referring to FIG. 4C, source and drain electrode materials formed of a conductive material may be deposited on the entire surface of the substrate including the pixel area A and the pad area B, and then patterned to form source and drain electrodes 460 on the pixel area A, and an interconnection layer 465 on the pad area B. The interconnection layer 465 of the pad area B may have protrusions and recesses due to morphology formed by the embossed patterns 455.

Figure 4D:
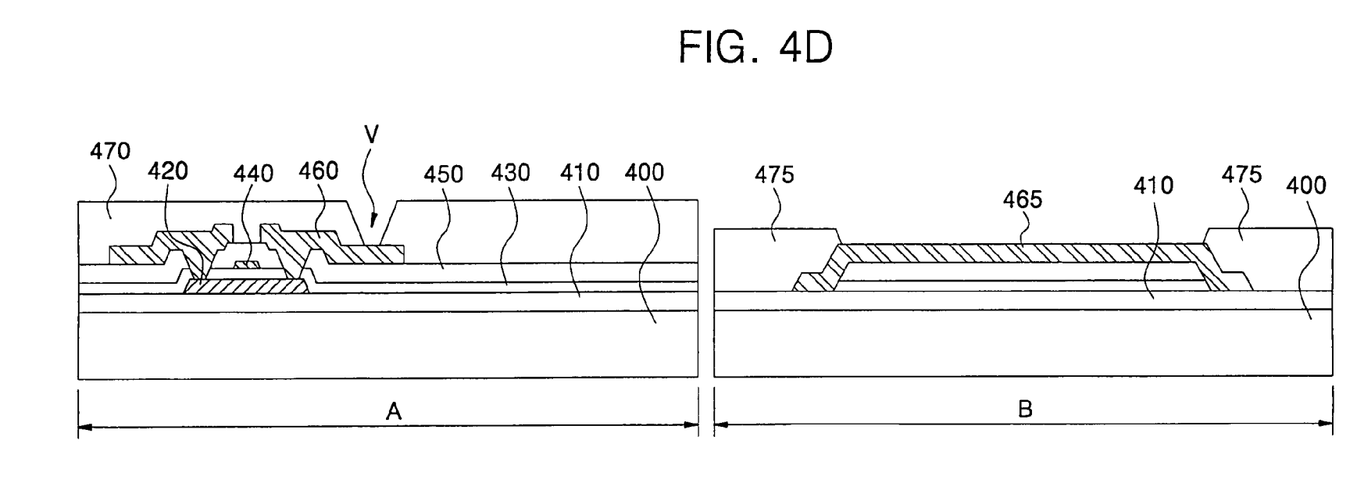

Referring to FIG. 4D, a planarization layer 470 may be formed on the entire surface of the substrate including the pixel area A and the pad area B using an organic material, e.g., a resin, using, e.g., spin coating. The planarization layer 470 of the pixel area A may then be etched to form a via-hole v for exposing portions of the source and drain electrodes 460, and at the same time a passivation layer 475 for exposing a central portion of the interconnection layer 465 and surrounding an edge of the interconnection layer 465 may be formed on the pad area B.

Figure 4E:
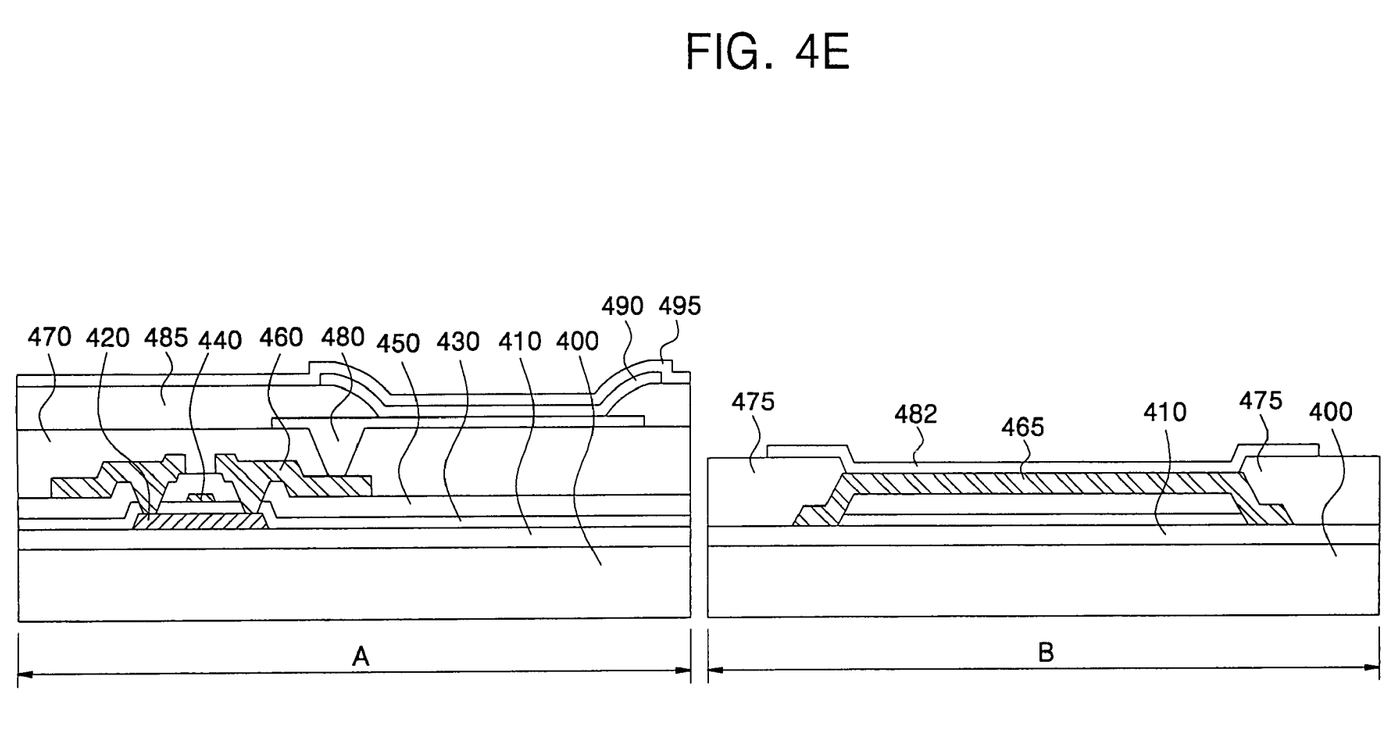

Referring to FIG. 4E, a first electrode 480 of the pixel area A, a pixel defining layer 485 for exposing a portion of the first electrode 480, which may be formed of an organic material, an organic layer 490 formed on the pixel defining layer 485 and including at least an organic emission layer, and a second electrode 495 formed on the organic layer 490 may be sequentially deposited. A reflective layer may be additionally formed between the first electrode 480 and the planarization layer 470.

When the first and second electrodes 480 and 495 are formed on the pixel area A, at least one of a first electrode pattern, a second electrode pattern, and a reflective layer pattern may be formed on the interconnection layer 465 and the passivation layer 475 of the pad area B to additionally form an auxiliary interconnection layer 482.

The process of forming the passivation layer 475 of the pad area B when the planarization layer 470 of the pixel area A is formed is illustrated in FIG. 4D and may alternatively be performed when the pixel defining layer 485 illustrated in FIG. 4E rather than the planarization layer 470 is formed.

Therefore, it will be appreciated that a height difference. i.e., a step difference, between the surfaces of the passivation layer 475 and the interconnection layer 465 is determined depending on the thickness of the embossed layer formed of the embossed pattern 455. In other words, as the embossed layer becomes thicker, the step difference between the passivation layer 475 and the interconnection layer 465 may become smaller.

For example, when the gate insulating layer 430 has a thickness of about 1000~2000 angstroms and the interlayer insulating layer 450 has a thickness of about 4000~6000 angstroms, the step difference between the passivation layer 475 and the interconnection layer 465 is reduced by about 5000~8000 angstroms.

Fabrication processes for the embodiment of the pad illustrated in FIG. 2C are illustrated by way of cross-sectional views in FIGS. 5A to 5E.

Figure 5A:
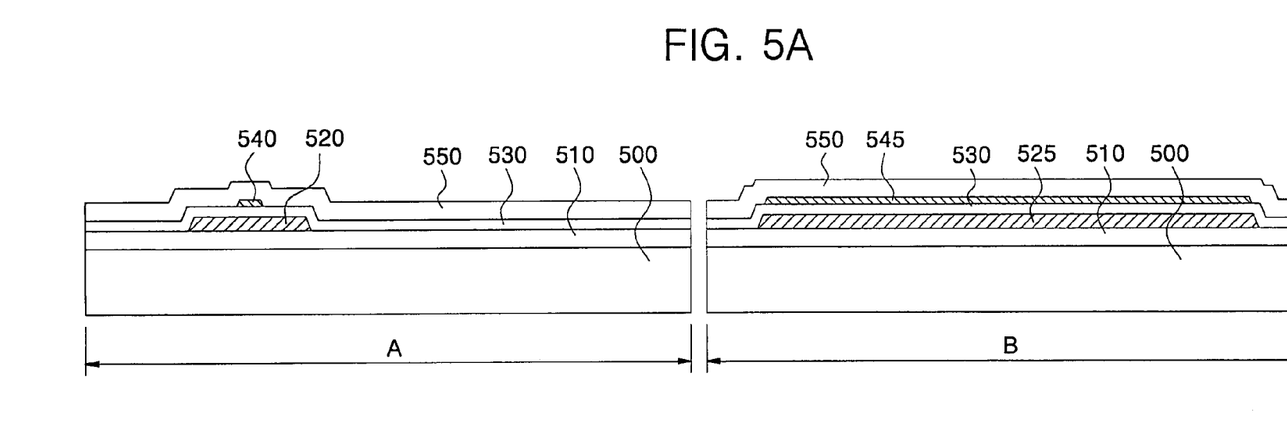
FIGS. 5A to 5E illustrate cross-sectional views of stages in a method for fabricating a pad illustrated in FIG. 2C.

Referring to FIG. 5A, a buffer layer 510 formed, e.g., of a silicon oxide layer, a silicon nitride layer, or a multi-layer thereof, may be deposited on a transparent insulating substrate 500, e.g., a glass or plastic substrate.

The buffer layer 510 may prevent diffusion of moisture and/or impurities generated from the lower substrate, and/or adjusts heat conduction speed during crystallization to promote crystallization of a semiconductor layer which may be formed on the entire substrate including a pixel area A and a pad area B.

A semiconductor layer 520 may be formed on the buffer layer 510 of the pixel area A, and a semiconductor layer pattern 525 is formed on the pad area B. The semiconductor layer 520 and the semiconductor layer pattern 525 may be formed by forming an amorphous silicon layer on the substrate, crystallizing the amorphous silicon layer into a polysilicon layer using one of various crystallization methods as noted above, and then patterning the polysilicon layer.

A gate insulating layer 530 may then be formed on the entire surface of the substrate including the pixel area A and the pad area B. A gate electrode material may be deposited on the gate insulating layer 530, and then patterned to form a gate electrode 540 on the pixel area A. A portion of the gate electrode material may also remain on the pad area B to form a gate electrode pattern 545. An interlayer insulating layer 550 is then formed on the entire surface of the substrate on which the gate electrode 540 is formed, including the pixel area A and the pad area B.

Figure 5B:
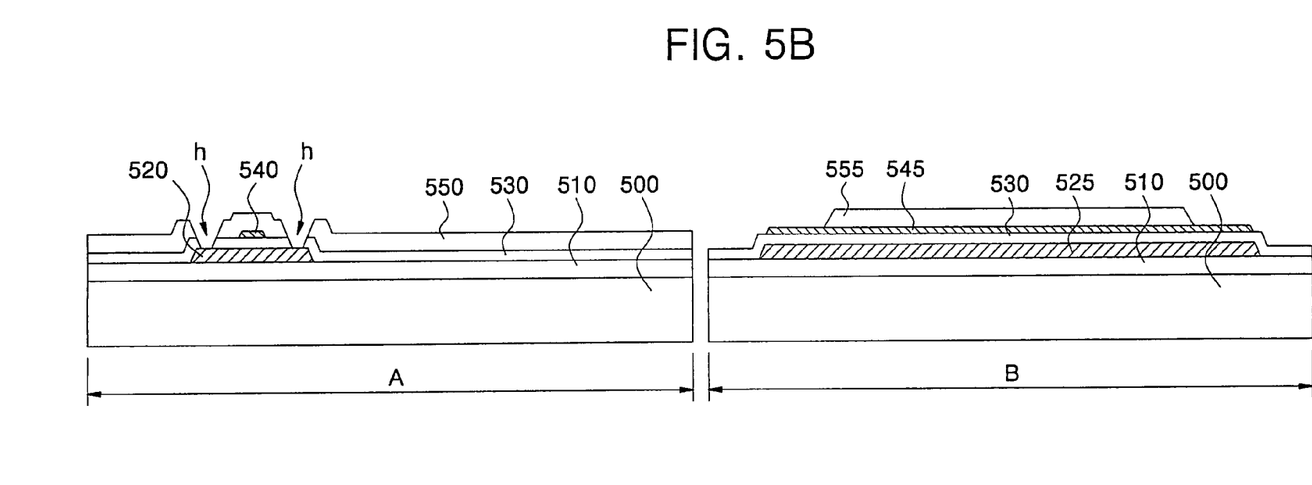

Referring to FIG. 5B, when a process of forming contact holes h for exposing portions of source and drain regions of the semiconductor layer formed on the pixel area A, i.e., a process of etching portions of the interlayer insulating layer 550 and the gate insulating layer 530, is performed, the interlayer insulating layer 550 of the pad area B may also be etched to form a single embossed pattern 555 forming an embossed layer. The embossed layer may be composed of the embossed pattern 555 and various layers under the embossed pattern 555, including the gate electrode pattern 545, the gate insulating layer 530, and the semiconductor layer pattern 525. The interlayer insulating layer 550 may be entirely removed in regions except a region of the pad area B where the embossed pattern 555 is formed. The gate insulating layer 530 of the pad area B may also be etched using a gate insulating layer pattern (not shown), as necessary. That is, when the etching process for forming the contact holes h is performed on the pad area B after forming a photoresist pattern that covers only the region where the embossed pattern is formed and opens the other regions, the interlayer insulating layer 550 may be patterned into the embossed pattern 555 by the photoresist pattern, and a gate insulating layer pattern may be formed by the gate insulating layer 530 using the gate electrode pattern 545 as a mask.

Figure 5C:
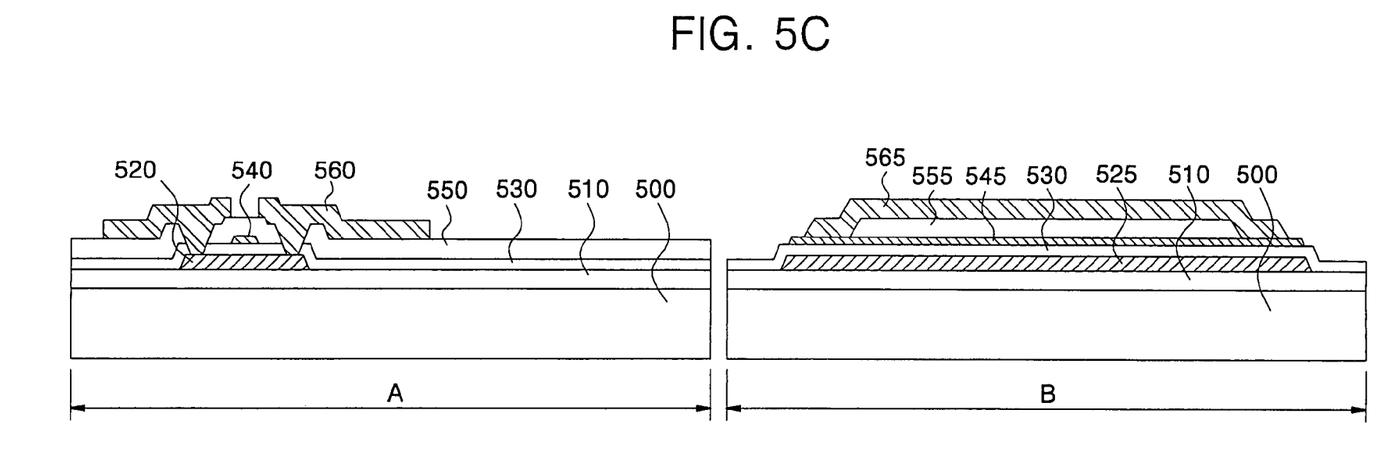

Referring to FIG. 5C, source and drain electrode materials formed of a conductive material may be deposited on the entire surface of the substrate including the pixel area A and the pad area B, and then patterned to form source and drain electrodes 560 on the pixel area A, and an interconnection layer 565 on the pad area B. The interconnection layer 565 of the pad area B may be formed at a higher position due to the embossed pattern 555 and various layers under the embossed pattern 555, including the gate electrode pattern 545, the gate insulating layer 530, and the semiconductor layer pattern 525.

Figure 5D:
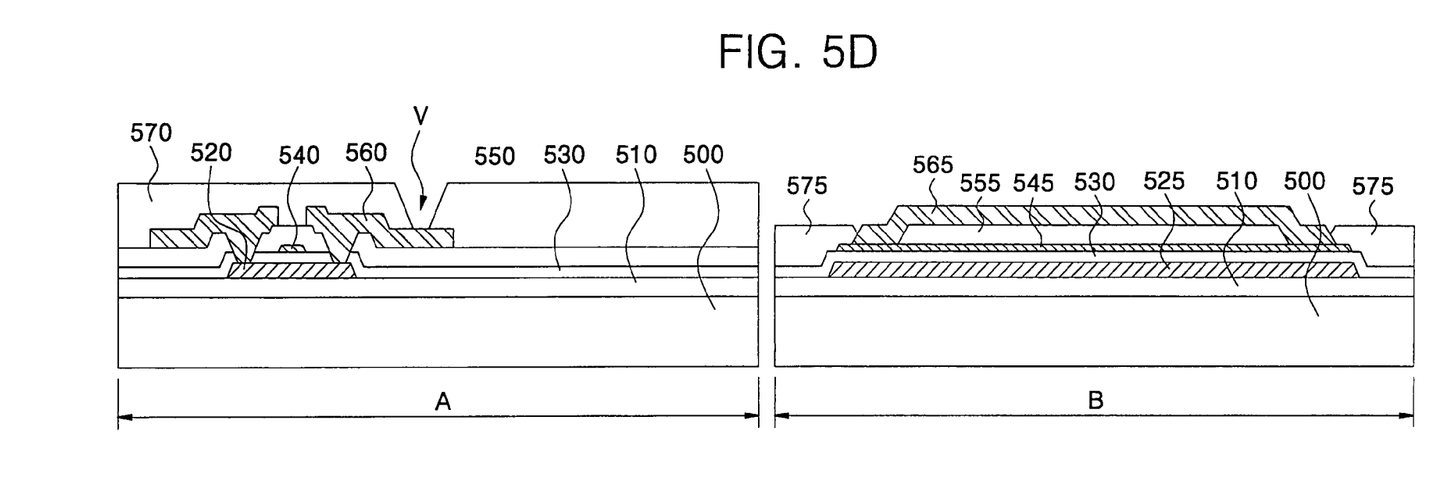

Referring to FIG. 5D, a planarization layer 570 is formed on the entire surface of the substrate including the pixel area A and the pad area B using an organic material such as resin through a method such as spin coating. The planarization layer 570 of the pixel area A is etched to form a via-hole v for exposing portions of the source and drain electrodes 560, and a passivation layer 575 for exposing a central portion of the interconnection layer 565 and surrounding an edge of the interconnection layer 565 may be formed on the pad area B.

Figure 5E:
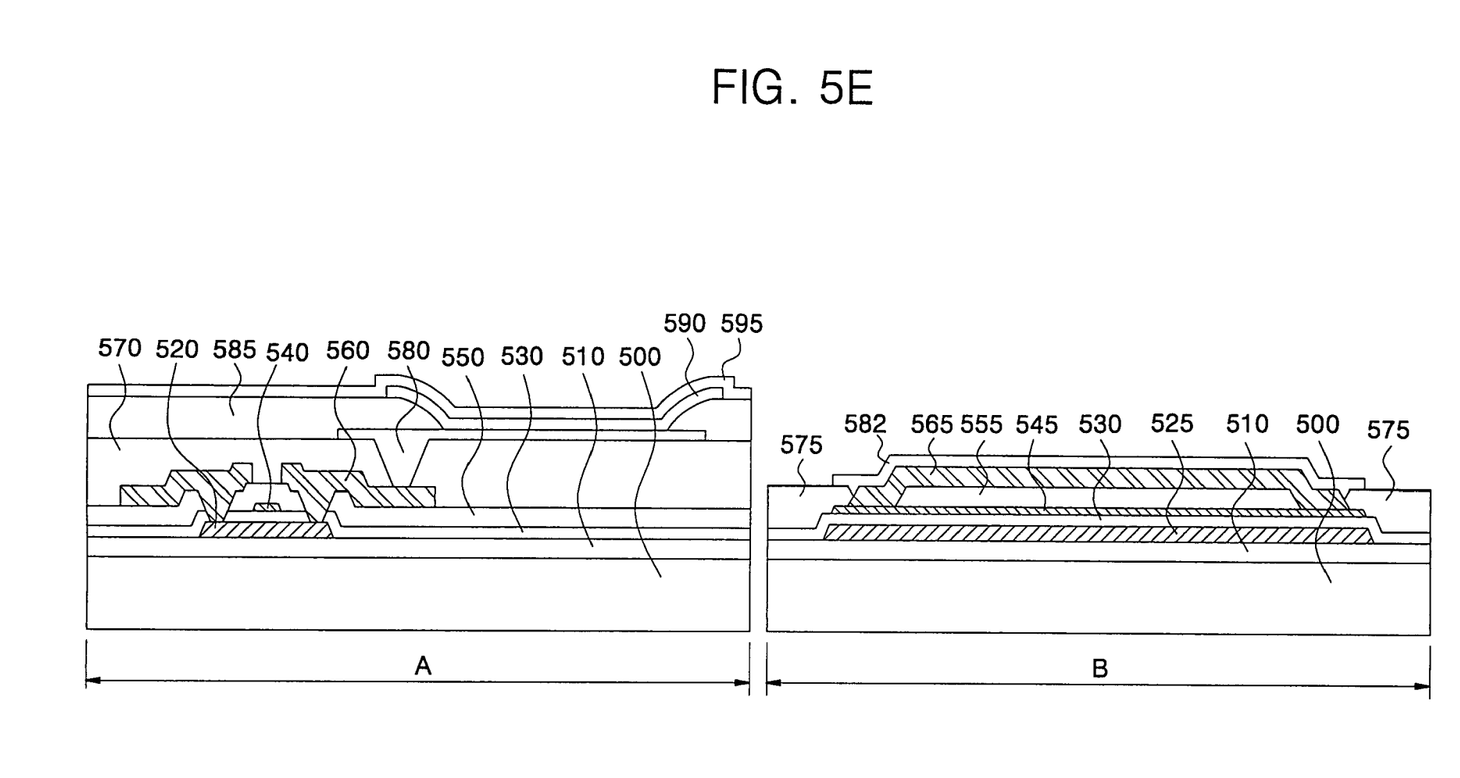

Referring to FIG. 5E, a first electrode 580 of the pixel area A, a pixel defining layer 585 for exposing a portion of the first electrode 580, which may be formed of an organic material, an organic layer 590 formed on the pixel defining layer 585 and including at least an organic emission layer, and a second electrode 595 formed on the organic layer 590 may be sequentially deposited. A reflective layer may be additionally formed between the first electrode 580 and the planarization layer 570.

When the first and second electrodes 580 and 595 are formed on the pixel area A, at least one of a first electrode pattern, a second electrode pattern, and a reflective layer pattern may be formed on the interconnection layer 565 and the passivation layer 575 of the pad area B to additionally form an auxiliary interconnection layer 582.

The process of forming the passivation layer 575 of the pad area B when the planarization layer 570 of the pixel area A is formed is illustrated in FIG. 5D, and the process of forming the passivation layer 575 may be performed when the pixel defining layer 585 illustrated in FIG. 5E rather than the planarization layer 570, is formed.

Therefore, it will be appreciated that a height difference (i.e., a step difference) between the surfaces of the passivation layer 575 and the interconnection layer 565 is determined depending on the thickness of the embossed layer formed of the embossed pattern 555 and the various layers under the embossed layer. In other words, as the embossed layer and the various layers become thicker, the step difference between the passivation layer 575 and the interconnection layer 565 may become smaller. In addition, if necessary, the interconnection layer 565 may be formed higher than the passivation layer 575.

For example, when the semiconductor layer has a thickness of 500~1500 angstroms, the gate insulating layer has a thickness of 1000~2000 angstroms, the gate electrode has a thickness of 1000~3000 angstroms and the interlayer insulating layer has a thickness of 4000~6000 angstroms, the step difference between the passivation layer and the interconnection layer is reduced by 6500~12500 angstroms.

As can be seen from the foregoing, a pad area and a method of fabricating the pad area in accordance with the present invention provide an advantage of reducing contact errors by increasing contact points of conductive balls and an interconnection layer on the pad area or by minimizing a step difference between a passivation layer and the interconnection layer, without the need for any additional masks or processes.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A pad area, comprising:
 a substrate;
 an embossed layer having an embossed pattern disposed on the substrate;
 an interconnection layer disposed on the embossed layer and covering at least the embossed pattern of the embossed layer, the interconnection layer covering at least an entire upper surface of the embossed layer, and the interconnection layer being a portion of at least one of source and drain electrodes and a gate electrode; and
 a passivation layer covering an edge of the interconnection layer.

2. The pad area as claimed in claim 1, further comprising a conductive ball disposed on the interconnection layer.

3. The pad area as claimed in claim 1, further comprising a gate electrode pattern disposed between the substrate and the embossed layer.

4. The pad area as claimed in claim 1, further comprising at least one of a first electrode pattern, a second electrode pattern, and a reflective layer pattern disposed on the interconnection layer.

5. The pad area as claimed in claim 1, wherein the embossed layer is formed of a single embossed pattern.

6. The pad area as claimed in claim 1, wherein the embossed layer is formed of at least two embossed patterns.

7. The pad area as claimed in claim 1, wherein the embossed layer is portions of an interlayer insulating layer and a gate insulating layer.

8. The pad area as claimed in claim 1, wherein the embossed layer is formed of at least one of a silicon layer, a gate insulating layer, a gate electrode, and an interlayer insulating layer.

9. The pad area as claimed in claim 1, wherein the interconnection layer is flat when the embossed layer thereunder is formed of a single embossed pattern.

10. The pad area as claimed in claim 1, wherein the interconnection layer is uneven when the embossed layer thereunder is formed of at least two embossed patterns.

11. The pad area as claimed in claim 1, wherein the interconnection layer is higher than the passivation layer.

12. The pad area as claimed in claim 1, wherein the passivation layer is a portion of a planarization layer or a pixel defining layer.

13. A method of fabricating a pad area, comprising:
forming a substrate;
forming a gate insulating layer and an interlayer insulating layer on the substrate, and patterning the layers to form an embossed layer;
depositing source and drain electrode materials on the substrate having the embossed layer, and then patterning the electrode materials to form an interconnection layer covering at least the embossed layer; and
forming a passivation layer covering an edge of the interconnection layer.

14. The method as claimed in claim 13, further comprising, before forming the gate insulating layer,
depositing a gate electrode material on the substrate, and then patterning the gate electrode material to form a gate electrode pattern.

15. The method as claimed in claim 13, further comprising, after forming the passivation layer,
forming an auxiliary interconnection layer on the interconnection layer and the passivation layer.

16. A method of fabricating a pad area, comprising:
preparing a substrate;
forming a semiconductor layer pattern on the substrate;
forming a gate insulating layer on the substrate having the semiconductor layer pattern;
forming a gate electrode pattern on the gate insulating layer;
forming an embossed pattern having a width larger than the gate electrode pattern on the substrate having the gate electrode pattern;
forming source and drain electrode materials on the substrate having the embossed pattern, and then patterning the electrode materials to form an interconnection layer covering at least the embossed pattern; and
forming a passivation layer covering an edge of the interconnection layer.

17. The method as claimed in claim 16, further comprising, after forming the passivation layer,
forming an auxiliary interconnection layer on the interconnection layer and the passivation layer.

18. The pad area as claimed in claim 1, wherein the conductive ball is directly on the interconnection layer.

19. The pad area as claimed in claim 1, wherein the passivation layer is completely separated from the embossed layer by the interconnection layer.

* * * * *